US012787347B2

(12) United States Patent
Jung et al.

(10) Patent No.: US 12,787,347 B2
(45) Date of Patent: Nov. 3, 2026

(54) SEMICONDUCTOR DEVICE INCLUDING 3D-STACKED FIELD-EFFECT TRANSISTORS HAVING ISOLATION STRUCTURE BETWEEN CONTACT PLUGS

(71) Applicant: SAMSUNG ELECTRONICS CO., LTD., Suwon-si (KR)

(72) Inventors: Myunghoon Jung, Clifton Park, NY (US); Panjae Park, Halfmoon, NY (US); Jaejik Baek, Watervliet, NY (US); Seungchan Yun, Waterford, NY (US); Myung Yang, Niskayuna, NY (US); Kang-ill Seo, Springfield, VA (US)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 481 days.

(21) Appl. No.: 18/228,231

(22) Filed: Jul. 31, 2023

(65) Prior Publication Data

US 2024/0282855 A1 Aug. 22, 2024

Related U.S. Application Data

(60) Provisional application No. 63/447,248, filed on Feb. 21, 2023.

(51) Int. Cl.
*H10D 30/63* (2025.01)
*H10D 30/01* (2025.01)
(Continued)

(52) U.S. Cl.
CPC ........... *H10D 30/63* (2025.01); *H10D 30/025* (2025.01); *H10D 62/151* (2025.01);
(Continued)

(58) Field of Classification Search
CPC .... H10D 30/63; H10D 30/025; H10D 62/151; H10D 64/252; H10D 64/251;
(Continued)

(56) References Cited

U.S. PATENT DOCUMENTS 8,928,090 B2 * 1/2015 Seo .................... H10D 30/0275 438/300
9,059,292 B2 * 6/2015 Ontalus .............. H10D 30/0212
(Continued)

OTHER PUBLICATIONS

Communication dated Jun. 24, 2024, issued by the European Patent Office in counterpart European Application No. 24150629.4.

*Primary Examiner* — Maliheh Malek
(74) *Attorney, Agent, or Firm* — Myers Bigel, P.A.

(57) ABSTRACT

Provided is a semiconductor device including a 3DSFET device which includes: a $1^{st}$ source/drain region; a $2^{nd}$ source/drain region, above the $1^{st}$ source/drain region, having a smaller width than the $1^{st}$ source/drain region, the $2^{nd}$ source/drain region being isolated from the $1^{st}$ source/drain region by a $1^{st}$ isolation structure; a $1^{st}$ contact plug on the $1^{st}$ source/drain region; a $2^{nd}$ contact plug on the $2^{nd}$ source/drain region; and a $2^{nd}$ isolation structure, between the $1^{st}$ contact plug and the $2^{nd}$ contact plug, isolating the $2^{nd}$ contact plug from the $1^{st}$ contact plug, wherein the $2^{nd}$ isolation structure is different and separate from the $1^{st}$ isolation structure.

20 Claims, 15 Drawing Sheets

(51) Int. Cl.
*H10D 62/13* (2025.01)
*H10D 64/23* (2025.01)
*H10D 84/01* (2025.01)
*H10W 20/00* (2026.01)

(52) U.S. Cl.
CPC ....... *H10D 64/252* (2025.01); *H10D 84/0151* (2025.01); *H10W 20/056* (2026.01)

(58) Field of Classification Search
CPC ............. H10D 84/0151; H10D 84/013; H10D 84/0149; H10D 84/038; H10D 84/83; H10D 88/00; H10D 88/01; H10D 30/6729; H10D 62/113; H10D 84/0158; H10D 84/834; H10D 84/8312; H01L 21/76883; H01L 21/76895; H01L 23/485; H10B 20/40–65; H10B 53/20; H10B 41/20–27; H10B 43/20–27; H10B 51/20; H10B 63/84–845; H10W 20/056; H10W 20/0698; H10W 20/40
See application file for complete search history.

(56) References Cited

U.S. PATENT DOCUMENTS 9,799,655 B1 * 10/2017 Cheng .................. H10D 30/024
10,374,040 B1 * 8/2019 Chanemougame .. H10D 30/024
10,418,449 B2 * 9/2019 Paul ....................... B82Y 10/00
10,622,301 B2 * 4/2020 Xu ...................... H10P 14/6339
11,101,270 B2 * 8/2021 Pillarisetty ......... H10D 84/0167
11,362,090 B2 * 6/2022 Wu ......................... G06F 30/31
11,488,947 B2 * 11/2022 Liebmann .............. H10D 88/00
11,502,167 B2 * 11/2022 Hong ..................... H10D 30/43
2016/0293545 A1 * 10/2016 Yoon .................... H10D 62/116
2017/0250261 A1 * 8/2017 Kim ....................... B82Y 10/00
2018/0286978 A1 * 10/2018 Cheng .................... H10B 20/40
2019/0027438 A1 * 1/2019 Yoon .................... H10D 62/116
2019/0172752 A1 * 6/2019 Hsu ...................... H10D 30/024
2019/0288004 A1 * 9/2019 Smith ................ H10D 84/0186
2020/0020587 A1 * 1/2020 Cheng .................... B82Y 10/00
2020/0098859 A1 * 3/2020 Reboh .................. H10D 30/014
2020/0295134 A1 * 9/2020 Do .......................... H10D 30/63
2020/0303497 A1 * 9/2020 Yeh ...................... H10D 30/025
2020/0365603 A1 * 11/2020 Moriwaki .............. B82Y 10/00
2021/0226021 A1 * 7/2021 Hung ................... H10D 30/024
2021/0343715 A1 * 11/2021 Wu .................... H10D 84/0186
2022/0109046 A1 * 4/2022 Hong ..................... H10D 30/43
2022/0157957 A1 * 5/2022 Jin ..................... H10D 30/6219
2022/0181453 A1 * 6/2022 Liebmann ............ H10B 10/125
2022/0270931 A1 * 8/2022 Huang ............... H10D 30/6219
2022/0271033 A1 * 8/2022 Chanemougame .. H10D 30/031
2022/0278211 A1 * 9/2022 Tsai ..................... H10B 10/125
2022/0302269 A1 * 9/2022 Zota ..................... H10D 30/014
2022/0344481 A1 * 10/2022 Hong ................... H10D 30/014
2023/0034575 A1 * 2/2023 Yoshida ............. H10D 30/6728
2023/0072305 A1 * 3/2023 Cheng .................. H10D 30/025
2023/0145135 A1 * 5/2023 Mignot ................ H10D 30/025
257/288
2023/0299205 A1 * 9/2023 Wu ...................... H10D 30/031
257/329
2023/0317802 A1 * 10/2023 Wang ..................... H10D 64/01
257/774
2024/0282670 A1 * 8/2024 Yang .................... H10D 30/014
2024/0332131 A1 * 10/2024 Kim ..................... H10D 30/014
2025/0203836 A1 * 6/2025 Yun ........................ H10B 10/12
2025/0324653 A1 * 10/2025 Liu ...................... H10D 30/024
2025/0357316 A1 * 11/2025 Chen .................... H10D 30/024

* cited by examiner

FIG. 3

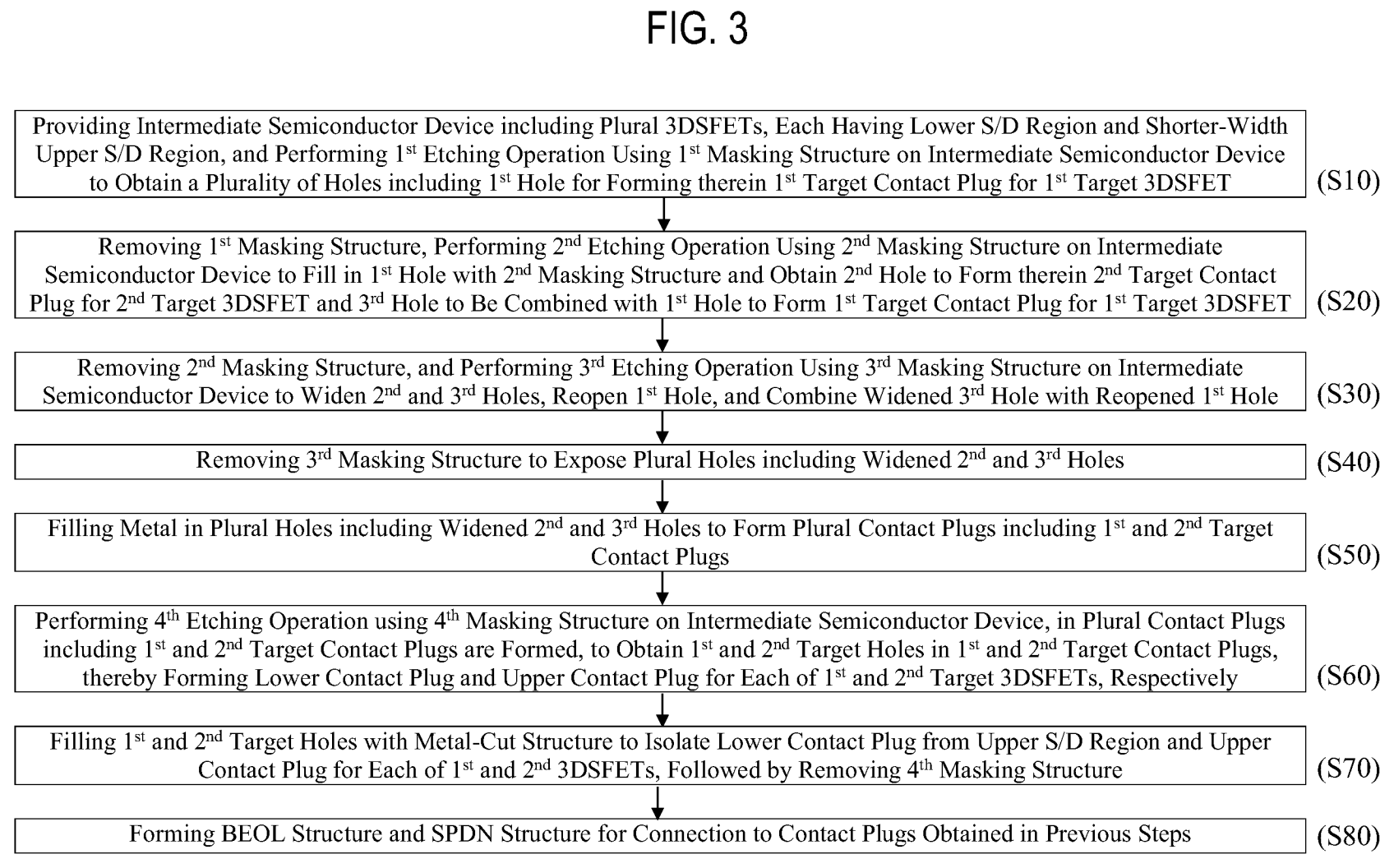

(S10) Providing Intermediate Semiconductor Device including Plural 3DSFETs, Each Having Lower S/D Region and Shorter-Width Upper S/D Region, and Performing 1st Etching Operation Using 1st Masking Structure on Intermediate Semiconductor Device to Obtain a Plurality of Holes including 1st Hole for Forming therein 1st Target Contact Plug for 1st Target 3DSFET

↓

(S20) Removing 1st Masking Structure, Performing 2nd Etching Operation Using 2nd Masking Structure on Intermediate Semiconductor Device to Fill in 1st Hole with 2nd Masking Structure and Obtain 2nd Hole to Form therein 2nd Target Contact Plug for 2nd Target 3DSFET and 3rd Hole to Be Combined with 1st Hole to Form 1st Target Contact Plug for 1st Target 3DSFET

↓

(S30) Removing 2nd Masking Structure, and Performing 3rd Etching Operation Using 3rd Masking Structure on Intermediate Semiconductor Device to Widen 2nd and 3rd Holes, Reopen 1st Hole, and Combine Widened 3rd Hole with Reopened 1st Hole

↓

(S40) Removing 3rd Masking Structure to Expose Plural Holes including Widened 2nd and 3rd Holes

↓

(S50) Filling Metal in Plural Holes including Widened 2nd and 3rd Holes to Form Plural Contact Plugs including 1st and 2nd Target Contact Plugs

↓

(S60) Performing 4th Etching Operation using 4th Masking Structure on Intermediate Semiconductor Device, in Plural Contact Plugs including 1st and 2nd Target Contact Plugs are Formed, to Obtain 1st and 2nd Target Holes in 1st and 2nd Target Contact Plugs, thereby Forming Lower Contact Plug and Upper Contact Plug for Each of 1st and 2nd Target 3DSFETs, Respectively

↓

(S70) Filling 1st and 2nd Target Holes with Metal-Cut Structure to Isolate Lower Contact Plug from Upper S/D Region and Upper Contact Plug for Each of 1st and 2nd 3DSFETs, Followed by Removing 4th Masking Structure

↓

(S80) Forming BEOL Structure and SPDN Structure for Connection to Contact Plugs Obtained in Previous Steps

SEMICONDUCTOR DEVICE INCLUDING 3D-STACKED FIELD-EFFECT TRANSISTORS HAVING ISOLATION STRUCTURE BETWEEN CONTACT PLUGS

CROSS-REFERENCE TO RELATED APPLICATION

This application is based on and claims priority from U.S. Provisional Application No. 63/447,248 filed on Feb. 21, 2023 in the U.S. Patent and Trademark Office, the disclosure of which is incorporated herein in its entirety by reference.

BACKGROUND

1. Field

Apparatuses and methods consistent with the disclosure relate to a semiconductor device including a three-dimensional stacked field-effect transistor (3DSFET) device having source/drain contact structures or plugs separated by a metal cut structure.

2. Description of Related Art

A 3DSFET may require a plurality of contact plugs (or contact structures) for each of a lower field-effect transistor and an upper field-effect transistor stacked on the lower field-effect transistor. For example, an upper contact plug is connected to an upper source/drain region of the upper field-effect transistor, and a lower contact plug is connected to a lower source/drain region of the lower field-effect transistor. The contact plugs, which may be referred to as middle-of-line (MOL) structures, may connect the source/drain regions to a voltage source or another circuit element through a back-end-of-line (BEOL) structure such as a BEOL metal line formed above the 3DSFET.

However, formation of the lower contact plug in the 3DSFET is complicated and difficult when the lower field-effect transistor and the upper field-effect transistor have the same size in their channel structures and source/drain regions. This is because a lower source/drain region may be vertically overlapped by a same-size upper source/drain region in the 3DSFET, whereby the lower contact plug vertically extended from the BEOL structure may not be able land on a top surface of the lower source/drain region.

To address this difficulty of forming the lower contact plug on the lower source/drain region of a 3DSFET, a backside distribution network (BSPDN) structure may be provided to connect a lower source/drain region or an upper source/drain region of the 3DSFET to a voltage source or another circuit element. The BSPDN structure may include a backside contact plug and a backside metal line such as a backside power rail, etc. which are buried in a substrate or a backside interlayer dielectric (ILD) structure.

As another example, a 3DSFET may be formed to have a smaller-width upper channel structure and a smaller-width upper source/drain region than the lower channel structure and the lower source/drain region, respectively, so that an upper contact plug may be vertically extended down through a space above the lower source/drain region at a side of the smaller-width upper source/drain region.

FIG. 1A illustrates a top plan view of a semiconductor device including a plurality of 3DSFETs, FIG. 1B illustrates a cross-section view of the semiconductor device of FIG. 1A along a line I-I' shown in FIG. 1A, and FIG. 1C illustrates an enlarged view of a portion A shown in FIG. 1B.

It is understood that FIG. 1A shows only gate structures and source/drain regions to show an overall structure of the semiconductor device including the plurality of 3DSFETs arranged in a channel-width direction, and thus, other structures such as BEOL structures including BEOL metal lines and MOL structures including contact plugs are not shown for drawing brevity purposes.

Referring to FIGS. 1A and 1B, a semiconductor device 10 includes $1^{st}$ to $5^{th}$ 3DSFETs T1-T5 arranged in a $1^{st}$ direction D1, which is a channel-width direction, intersecting a 2nd direction, which is a channel-length direction in which a current flows between source/drain regions. The $1^{st}$ direction D1 may also refer to a width direction of a source/drain region. Although FIGS. 1A and 1B show that the semiconductor device 10 have only five 3DSFETs, there may be more or less than five 3DSFETs arranged in the $1^{st}$ direction D1 and/or the $2^{nd}$ direction D2.

Each of the 3DSFETs T1-T5 may include a lower field-effect transistor 100L at a lower stack and an upper field-effect transistor 100U at an upper stack. The lower field-effect transistor 100L may include two lower source/drain regions 113 connected to each other through a lower channel structure which is surrounded by a lower gate structure 115, and the upper field-effect transistor 100U may include two upper source/drain regions 123 connected to each other through an upper channel structure surrounded by an upper gate structure 125. The lower channel structure and the upper channel structure are not shown in the drawings as they are covered by the lower gate structure 115 and the upper gate structure 125, respectively.

The lower source/drain regions 113 and the upper source/drain regions 123 may be respectively connected to lower contact plugs 117, upper contact plugs 127, via structures 131 and backside contact plugs 107, which are connected to a plurality of BEOL metal lines 138 and backside metal lines 108 arranged in the $1^{st}$ direction D1 and extended in the $2^{nd}$ direction D2.

For example, the $1^{st}$ 3DSFET T1 may include a lower source/drain region 113 and an upper source/drain region 123 connected to two backside metal lines 108 through a backside contact plug 107 and an upper contact plug 127, respectively. The $2^{nd}$ 3DSFET T2 may include a lower source/drain region 113 and an upper source/drain region 123 connected to a BEOL metal line 138 though a via structure 131 and a single common contact plug 137. The $3^{rd}$ 3DSFET T3 may include a lower source/drain region 113 and an upper source/drain region 123 connected to two BEOL metal lines 138 through a lower contact plug 117 and an upper contact plug 127 and two via structures 131, respectively. The $4^{th}$ 3DSFET T4 may include a lower source/drain region 113 connected to a BEOL metal line 138 through a lower contact plug 117 and a via structure 131 and an upper source/drain region 123 directly connected to a backside metal line 108 through an upper contact plug 127. The $5^{th}$ 3DSFET T5 may include a lower source/drain region 113 connected to a backside metal line 108 through a backside contact plug 107 and an upper source/drain region 123 connected to a BEOL metal line 138 through an upper contact plug 127 and a via structure 131.

The 3DSFETs T1-T5 in the semiconductor device 10 may be isolated (or electrically insulated) from each other by a $1^{st}$ ILD structure 116. For example, the $1^{st}$ ILD structure 116 may include silicon oxide (e.g., SiO, $SiO_2$, etc.). The BEOL metal lines 138 may be isolated from each other by a $2^{nd}$ ILD structure 136. The backside metal lines 108 may be isolated from each other by a $3^{rd}$ ILD structure 106. The ILD structures 116, 136 and 106 may be formed of a material having a low dielectric constant κ. The dielectric constant of the material forming the ILD structures 116, 136 and 106 may be smaller than 3.9.

The metal lines 108 and 138, the via structures 131, and contact plugs 117 and 127 may each be formed a metal such as copper (Cu), aluminum (Al), tungsten (W), molybdenum (Mo), ruthenium (Ru), cobalt (Co), or their compound, not being limited thereto. Further, at an outer surface of each of these metal structures may be formed a barrier layer 109 to prevent or reduce diffusion of a metal or a metal compound into the $1^{st}$ ILD structure 116. The barrier layer 109 may be formed of a material such as titanium nitride (e.g., TiN), tantalum nitride (e.g., TaN), tungsten nitride (e.g., WN), cobalt nitride (e.g., CON), etc.

In the semiconductor device 10, the upper source/drain region 123 may have a smaller width than a lower source/drain region 113 therebelow at least to provide a space above the lower source/drain region 113 at a side of the smaller-width upper source/drain region 123. Thus, for the $3^{rd}$ 3DSFET T3 and the $4^{th}$ 3DSFET T4, a lower contact plug 117 connected to a BEOL metal line 138 through a via structure 131 may be vertically extended down through the space above the lower source/drain region 113 at a side of the smaller-width upper source/drain region 123. This space in the ILD structure 116 wherein the lower contact plug 117 is formed may be referred to as a "non-overlapping region" herebelow.

However, as shown in FIG. 1C, a distance D1 between the lower contact plug 117 and the upper source/drain region 123 and a distance D2 between the lower contact plug 117 and the upper contact plug 127 connected to the upper source/drain region 123 are very limited in the nano-scale footprint of the 3DSFETs T3 and T4, and thus, there is an increased risk of short-circuit between these structures of the 3DSFETs T3 and T4 regardless of the ILD structure 116 formed therebetween. Moreover, the lower contact plug 117 may have a very small bottom width W1 unlike a top width W2 thereof, so that a contact resistance between the lower contact plug 117 and the lower source/drain region 113 may increase in the 3DSFETs T3 and T4.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor device in which at least one 3DSFET is formed with a lower contact plug on a lower source/drain region and a upper contact plug on an upper source/drain region separated from a $1^{st}$ isolation structure different from a $2^{nd}$ isolation structure isolating the lower source/drain region from the upper source/drain region. The embodiments also provide a method of manufacturing this semiconductor device.

According to embodiments, there is provided a semiconductor device including a 3DSFET device which may include: a $1^{st}$ source/drain region; a $2^{nd}$ source/drain region, above the $1^{st}$ source/drain region, having a smaller width than the $1^{st}$ source/drain region, the $2^{nd}$ source/drain region being isolated from the $1^{st}$ source/drain region by a $1^{st}$ isolation structure; a $1^{st}$ contact plug on the $1^{st}$ source/drain region; a $2^{nd}$ contact plug on the $2^{nd}$ source/drain region; and a $2^{nd}$ isolation structure, between the $1^{st}$ contact plug and the $2^{nd}$ contact plug, isolating the $2^{nd}$ contact plug from the $1^{st}$ contact plug, wherein the $2^{nd}$ isolation structure is different and separate from the $1^{st}$ isolation structure.

According to an embodiment, the $2^{nd}$ isolation structure may be extended to a space between the $1^{st}$ contact plug and the $2^{nd}$ source/drain region, and isolate the $1^{st}$ contact plug from the $2^{nd}$ source/drain region.

According to an embodiment, the $2^{nd}$ isolation structure may include a material such as silicon nitride different from a material such as silicon oxide forming the $1^{st}$ isolation structure.

According to embodiments, there is provided a semiconductor device which may include another 3DSFET device including: a $3^{rd}$ source/drain region, a $4^{th}$ source/drain region, above the $1^{st}$ source/drain region, having a smaller width than the $3^{rd}$ source/drain region, a $3^{rd}$ contact plug on the $3^{rd}$ source/drain region, a $4^{th}$ contact plug on the $4^{th}$ source/drain region, and another $2^{nd}$ isolation structure, between the $3^{rd}$ contact plug and the $4^{th}$ contact plug, isolating the $4^{th}$ contact plug from the $3^{rd}$ contact plug, wherein the other $2^{nd}$ isolation structure is different and separate from the $1^{st}$ isolation structure isolating the $4^{th}$ source/drain region from the $3^{rd}$ source/drain region; a plurality of $1^{st}$ metal lines below at least one of the $1^{st}$ source/drain region and the $3^{rd}$ source/drain region; and a plurality of $2^{nd}$ metal lines above at least one of the $2^{nd}$ source/drain region and the $4^{th}$ source/drain region. At least one of the $1^{st}$ to $4^{th}$ contact plugs may be connected to at least one of the $1^{st}$ metal lines, and another at least one of the $1^{st}$ to $4^{th}$ contact plugs may be connected to at least one of the $2^{nd}$ metal lines.

According to embodiments, there is provided a method of manufacturing a semiconductor device. The method may include: providing at least one three-dimensionally-stacked field-effect transistor (3DSFET) including a $1^{st}$ source/drain region and a $2^{nd}$ source/drain region, above the $1^{st}$ source/drain region, having a smaller width than the $1^{st}$ source/drain region and isolated from the $1^{st}$ source/drain region by a $1^{st}$ isolation structure; forming a $1^{st}$ hole exposing both the $1^{st}$ source/drain region and the $2^{nd}$ source/drain region; forming in the $1^{st}$ hole a contact plug contacting both the $1^{st}$ source/drain region and the $2^{nd}$ source/drain region; forming a $2^{nd}$ hole dividing the contact plug into a $1^{st}$ contact plug on the $1^{st}$ source/drain region and a $2^{nd}$ contact plug on the $2^{nd}$ source/drain region; and forming in the $2^{nd}$ hole a $2^{nd}$ isolation structure different and separate from the $1^{st}$ isolation structure.

According to an embodiment, the $1^{st}$ hole may be formed by forming an initial hole exposing one of the $1^{st}$ source/drain region and the $2^{nd}$ source/drain region; and widening the initial hole to obtain the $1^{st}$ hole.

BRIEF DESCRIPTION OF DRAWINGS

Example embodiments of the disclosure will be more clearly understood from the following detailed description taken in conjunction with the accompanying drawings in which:

FIG. 3 illustrate a flowchart of a method of forming a semiconductor device shown in FIGS. 2A and 2B, according to an embodiment;

DETAILED DESCRIPTION OF EMBODIMENTS

Figure 1A:
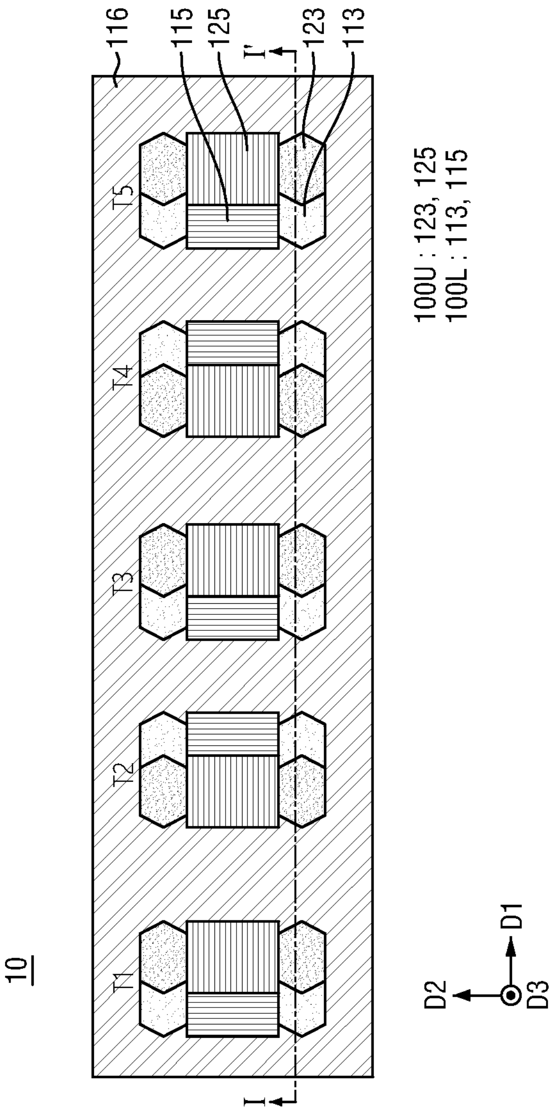
FIG. 1A illustrates a top plan view of a semiconductor device including a plurality of 3DSFETs.

The embodiments of the disclosure described herein are example embodiments, and thus, the disclosure is not limited thereto, and may be realized in various other forms. Each of the embodiments provided herein is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "lower" element and an "upper" element" may be an "upper" element and a "lower" element when a device or structure including these elements are differently oriented. Thus, in the descriptions herebelow, the "lower" element and the "upper" element may also be referred to as a "1$^{st}$" element or a "2$^{nd}$" element, respectively, as long as their structural relationship is clearly understood in the context of the descriptions. Similarly, the terms a "left" element and a "right" element may be respectively referred to as a "1$^{st}$" element and a "2$^{nd}$" element with necessary descriptions to distinguish the two elements.

It will be understood that, although the terms "1$^{st}$," "2$^{nd}$," "3$^{rd}$," "4$^{th}$," "5$^{th}$," "6$^{th}$," etc. may be used herein to describe various elements, these elements should not be limited by these terms. These terms are only used to distinguish one element from another element. Thus, a 1$^{st}$ element discussed below could be termed a 2$^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a field-effect transistor and materials forming the same may or may not be described in detail herein. For example, a certain isolation layer or structure, an etch stop layer, a spacer layer, etc. of a semiconductor device and materials forming the same may be omitted herein when this layer or structure is not related to the novel features of the embodiments. As another example, silicon (Si), germanium (Ge), impurities (dopants), various metals, or the like forming a substrate, a channel structure, source/drain regions, gate structures, etc. of a field-effect transistor may not be described when these materials are not related to the novel features of the embodiments.

Herebelow, various embodiments of the disclosure will be described in reference to FIGS. 2A-2B to 5.

Figure 2A:
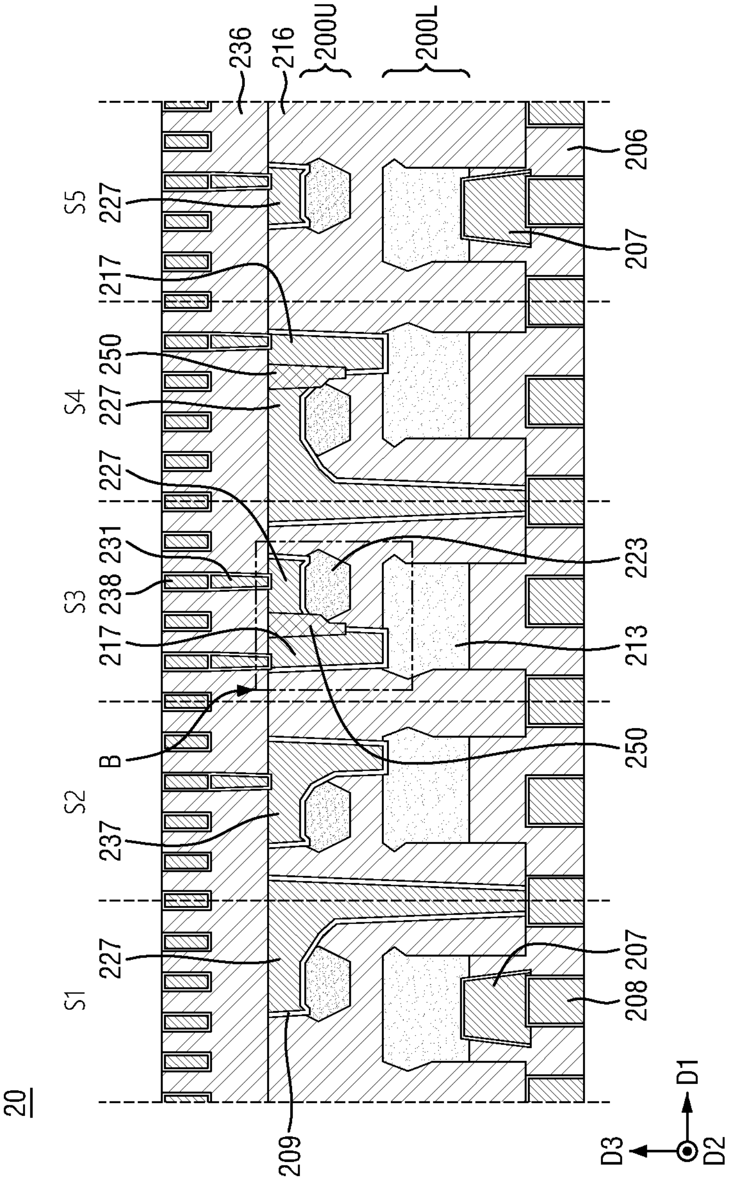
FIG. 2A illustrates a cross-section view of a semiconductor device including a plurality of 3DSFETs, according to an embodiment.
Figure 2B:
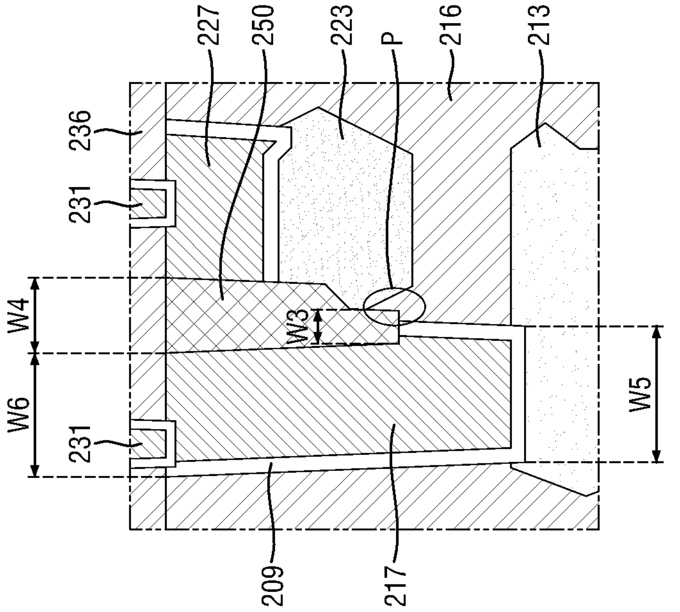
FIG. 2B illustrates an enlarged view of a portion B shown in FIG. 2A.

FIG. 2A illustrates a cross-section view of a semiconductor device including a plurality of 3DSFETs, according to an embodiment, and FIG. 2B illustrates an enlarged view of a portion B shown in FIG. 2A.

Figure 1B:
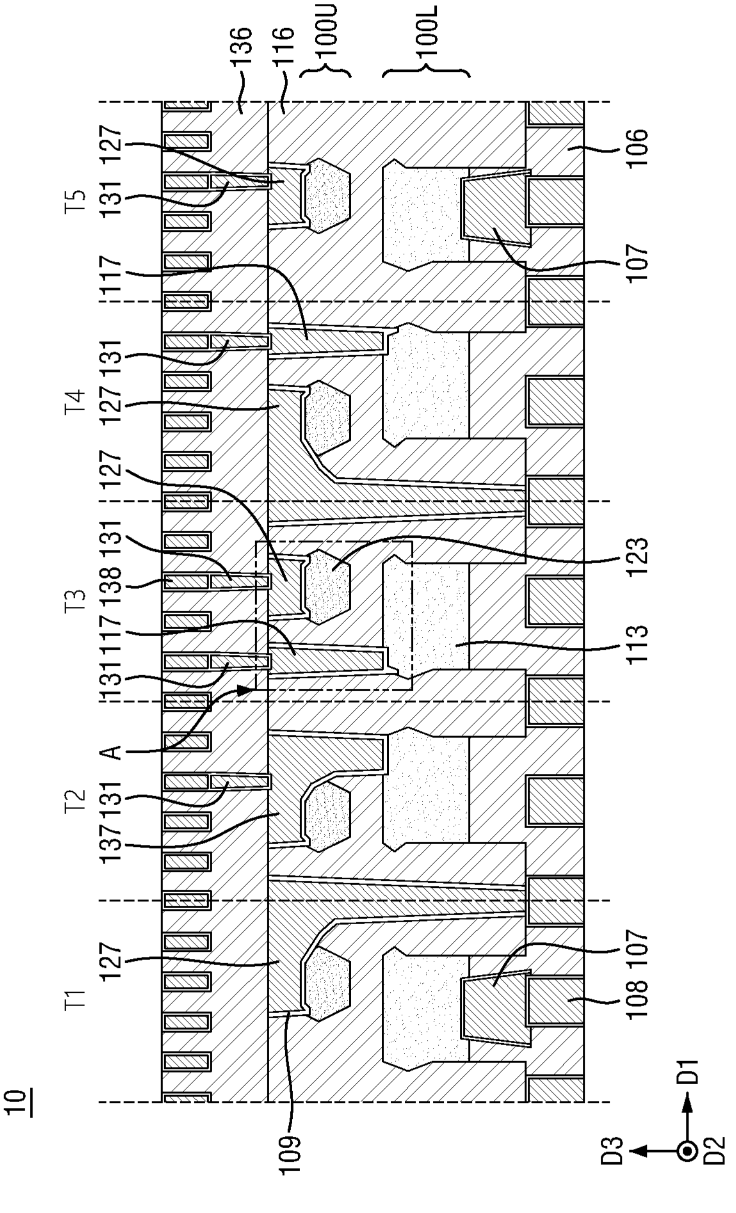
FIG. 1B illustrates a cross-section view of the semiconductor device of FIG. 1A along a line I-I' shown in FIG. 1A.

A semiconductor device 20 shown in FIG. 2 according to an embodiment may have the same or similar structures as those included in the semiconductor device 10 shown in FIGS. 1A and 1B. For example, the semiconductor device 20 may also include $1^{st}$ to $5^{th}$ 3DSFETs S1-S5, each of which includes a lower field-effect transistor 200L including lower source/drain regions 213 and an upper field-effect transistor 200U including upper source/drain regions 223. Like the source/drain regions 113 and 123 in FIGS. 1A and 1B, the source/drain regions 213 and 223 may also be connected to a plurality of BEOL metal lines 238 and backside metal lines 208 through via structures 231, lower contact plugs 217, upper contact plugs 227, a common contact plug 237 and backside contact plugs 207, respectively. Further, the upper source/drain regions 213 may have smaller widths than the lower source/drain regions 223 formed thereabove.

In addition, a $1^{st}$ ILD structure 216 formed of the same or similar material of the $1^{st}$ ILD structure 116 of the semiconductor device 10 may isolate the $1^{st}$ to $5^{th}$ 3DSFETs S1-S5 from each other. Thus, the lower source/drain regions 213, the upper source/drain regions 223, the lower contact plugs 217 and the upper contact plugs 227 of adjacent two 3DSFETs in the semiconductor device 20 may be isolated from each other by the $1^{st}$ ILD structure 216. A $2^{nd}$ ILD structure 236 and a $3^{rd}$ ILD structure 206 may also be the same as similar to the corresponding ILD structures 136 and 106. Thus, duplicate descriptions thereof may be omitted herebelow.

However, in the $3^{rd}$ 3DSFET S3 and the $4^{th}$ 3DSFET S4, the lower contact plug 217 may be isolated from the upper source/drain region 223 and the upper contact plug 227 by a metal-cut structure 250 which may be an isolation structure different from the ILD structures 216, 236 and 206, according to an embodiment. According to an embodiment, the metal-cut structure 250 may be formed of a material such as silicon nitride (e.g., SiN, $Si_3N_4$, etc.), different from silicon oxide (e.g., SiO, $SiO_2$, etc.) forming the ILD structures 216, 236 and 206. According to an embodiment, the metal-cut structure 250 may be formed of a dielectric material having a low dielectric constant κ, which may be greater than the dielectric constant k of the ILD structures 216, 236 and 206. Alternatively or additionally, the material forming the metal-cut structure 250 may be the same material forming the ILD structures 216, 236 and 206, according to an embodiment.

As will be described later in the descriptions of manufacturing the semiconductor device 20 in reference to FIGS. 4A-4H, the metal-cut structure 250 may be separately formed after the $1^{st}$ ILD structure 216 and the contact plugs 217 and 227 are formed. Thus, there may be formed an interface between the $1^{st}$ ILD structure 216 and the metal-cut structure 250 at least at a position P where the $1^{st}$ ILD structure 216 contacts the metal-cut structure 250 in the semiconductor device 20, as shown in FIG. 2B.

According to an embodiment, the metal-cut structure 250 may be formed by etching a single contact plug, formed on the lower source/drain region 213 and the upper source/drain region 223, from a top surface thereof to obtain a hole in the signal contact plug, and depositing an isolation material such as silicon nitride or silicon oxide in the hole obtained by the etching operation. At this time, the etching operation to obtain the hole may be a vertical anisotropic etching, for example, which forms the hole to have a tapering shape in a downward direction, as will be described later in reference to FIGS. 4A-4H. Thus, a bottom width W3 of the hole and the metal-cut structure 250 formed therein may be smaller than a top width W4 thereof. Accordingly, the lower contact plug 217 of the 3DSFETs S3 and S4 of which a width is determined by the width of the metal-cut structure 250 may have a greater bottom width W5 than a top width W6.

Figure 1C:
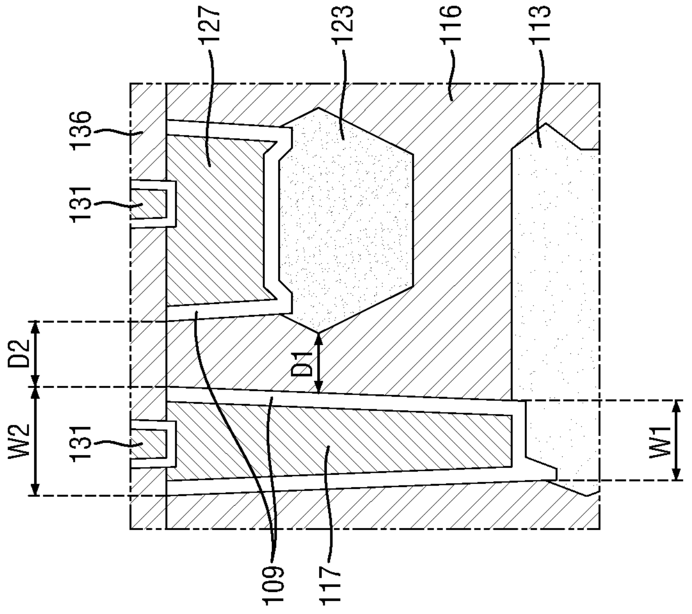
FIG. 1C illustrates an enlarged view of a portion A shown in FIG. 1B.

Further, the bottom width W5 of the lower contact plug 217 of the 3DSFETs S3 and S4 may be formed to be greater than the bottom width W1 of the lower contact plug 117 of the 3DSFETs T3 and T4 in the semiconductor device 10 shown in FIGS. 1A and 1B. This is because the lower contact plug 217 of the 3DSFETs S3 and S4 may be formed without a concern of a short-circuit risk as will be described later in reference to FIGS. 4A-4H. Thus, the 3DSFETs S3 and S4 may have a smaller contact resistance between the lower contact plug 217 and the lower source/drain region 213, compared to the contact resistance between the lower contact plug 117 and the lower source/drain region 113 of the 3DSFETs T3 and T4 in the semiconductor device 10 shown in FIGS. 1A-1C.

Moreover, in the 3DSFETs S3 and S4 of the semiconductor device 20, no barrier layer may be formed at a side surface of each of the contact plugs 217 and 227 contacting the metal-cut structure 250. For example, as shown in FIGS. 2A and 2B, the lower contact plug 217 and the upper contact plug 227 of the $3^{rd}$ 3DSFET S3 has no barrier layer 209 on their side surfaces contacting the metal-cut structure 250. In addition, as shown in FIG. 2B, as the metal-cut structure 250 is formed at a side of the upper source/drain region 223 by etching a portion of the single contact plug, as described above, at a side of the upper source/drain region 223 above the lower source/drain region 213, at least a side portion of the upper source/drain region 223 facing a non-overlapping region of the 3DSFET S3 and S4 may be dented by the etching operation performed on the single contact plug, as will be further described later in reference to FIGS. 4A-4H. According to an embodiment, a top edge portion including a portion of a top surface of the upper source/drain region 223 facing the non-overlapping region may also be dented.

Thus, the metal-cut structure 250 of the embodiments provide 3DSFETs in which a risk of short-circuit between a lower contact plug and an upper source/drain region and a risk of short-circuit between the lower contact plug and an upper contact plug may be prevented or reduced. In addition, the metal-cut structure 250 may enable formation of a lower contact plug having a greater bottom width, thereby achieving a smaller contact resistance. Moreover, a single contact plug deposited on the upper source/drain region and the lower source/drain region before being etched to form the metal-cut structure 250 therein has an even greater bottom width, and thus, a manufacturing simplicity may also be achieved, as will be described later in reference to FIGS. 4A-4H.

FIG. 2A show that the lower contact plugs 217, the upper contact plugs 227 and the common contact plug 237 are connected to top surfaces of the lower source/drain regions 213 and the upper source/drain regions 223, respectively. However, alternatively or additionally, these contact plugs 217, 227 and 237 may be connected to side surfaces of the upper source/drain regions 223 and the lower source/drain region 213, according to embodiments.

In the present embodiments, each of the lower field-effect transistor 200L and the upper field-effect transistor 200U forming each of the 3DSFETs S1-S5 may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, or as a multi-bridge channel field-effect transistor (MBCFET). Also in the present embodiments, each of the lower field-effect transistor 200L and the upper field-effect transistor 200U may be a p-type field-effect transistor or an n-type field-effect transistor.

FIG. 3 illustrate a flowchart of a method of forming the semiconductor device shown in FIGS. 2A and 2B, according to an embodiment. FIGS. 4A to 4H illustrate intermediate semiconductor devices after respective steps of the method described in reference to FIG. 3 are performed, according to embodiments.

As the semiconductor device manufactured based on the method described herebelow may be the same as or similar to the semiconductor device 20 shown in FIGS. 2A and 2B, the same or similar reference numbers may be used to denote the same or similar structures or elements in the semiconductor device 20. Duplicate descriptions thereof may be omitted herebelow.

In operations S10, an intermediate semiconductor device including a plurality of 3DSFETs each of which has a lower source/drain region and a shorter-width upper source/drain region may be provided on a substrate, and a $1^{st}$ etching operation using a $1^{st}$ masking structure may be performed on the intermediate semiconductor device to obtain a plurality of holes including a $1^{st}$ hole for forming therein a $1^{st}$ target contact plug for a $1^{st}$ target 3DSFET.

Figure 4A:
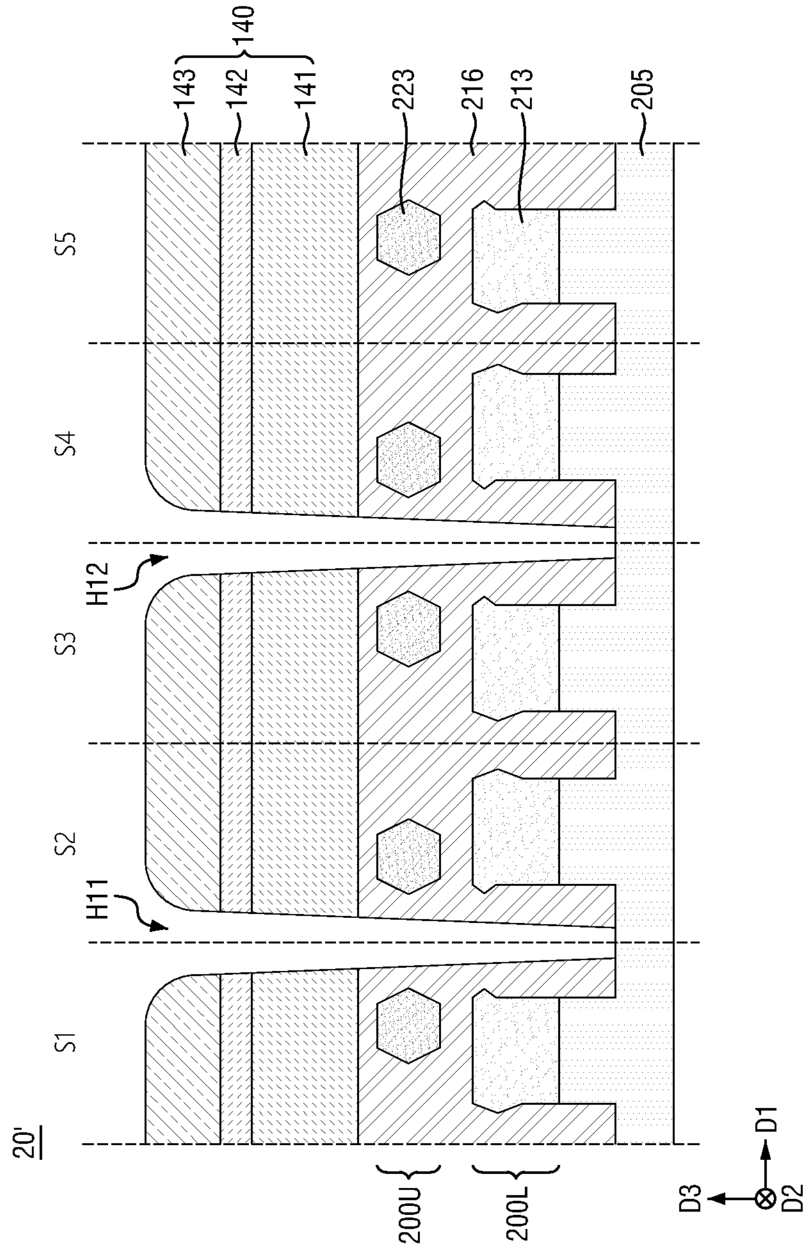
FIGS. 4A-4H illustrate intermediate semiconductor devices after respective steps of the method described in reference to FIG. 3 are performed, according to embodiments.

Referring to FIG. 4A, an intermediate semiconductor device 20' including $1^{st}$ to $5^{th}$ 3DSFETs S1-S5 may be formed on a substrate 205, and a $1^{st}$ masking structure 140 may be formed on the intermediate semiconductor device 20'. Each of the 3DSFETs S1-S5 arranged in the $1^{st}$ direction D1 may include a lower field-effect transistor 200L including lower source/drain regions 213 and an upper field-effect transistor 200U including upper source/drain regions 223. The lower source/drain regions 213 and the upper source/drain regions 223 may be isolated from each other through a $1^{st}$ ILD structure 216.

Further, based on the $1^{st}$ masking structure 140, the intermediate semiconductor device 20' may be etched at selected positions to form holes H11 and H12 in the $1^{st}$ ILD structure 216. The $1^{st}$ masking structure 140 may include, for example, an organic planarization layer (OPL) 141, a silicon-containing anti-reflective coating (SiARC) layer 142 and a plurality of photoresist patterns 143, not being limited thereto. The etching operation used to form the holes H11 and H12 in the $1^{st}$ ILD structure 216 may be dry etching and/or wet etching, for example, not being limited thereto.

The hole H11 may be formed between the $1^{st}$ 3DSFET S1 and the $2^{nd}$ 3DSFET S2 to expose the substrate 205 at a bottom of the hole H11. In the hole H11, an upper contact plug 227 connecting an upper source/drain region 223 of the $1^{st}$ 3DSFET S1 to a backside metal line 208 is to be formed in a later step.

The hole H12 may be formed between the $3^{rd}$ 3DSFET S3 and the $4^{th}$ 3DSFET S4 to also expose the substrate 205 at a bottom of the hole H12. The hole H12 may be provided to form therein a $1^{st}$ target contact plug CM1 which will be etched to form an upper contact plug 227 and a lower contact plug 217 isolated by a metal-cut structure 250 for the $4^{th}$ 3DSFET S4 in a later step. The hole H12 may correspond to the $1^{st}$ hole referred to in operation S10 of FIG. 3.

Herein, the $4^{th}$ 3DSFET S4 and the $3^{rd}$ 3DSFET S3 may be a $1^{st}$ target 3DSFET and a $2^{nd}$ target 3DSFET in each of which the metal-cut structure 250 dividing a single contact plug to form a lower contact plug and an upper contact plug having an improved connection performance.

In operation S20, the $1^{st}$ masking structure may be removed, and a $2^{nd}$ etching operation using a $2^{nd}$ masking structure may be performed on the intermediate semiconductor device to fill in the $1^{st}$ hole with the $2^{nd}$ masking structure and obtain a $2^{nd}$ hole to form therein a $2^{nd}$ target contact plug for a $2^{nd}$ target 3DSFET and a $3^{rd}$ hole to be combined with the $1^{st}$ hole to form the $1^{st}$ target contact plug for the $1^{st}$ target 3DSFET.

Figure 4B:
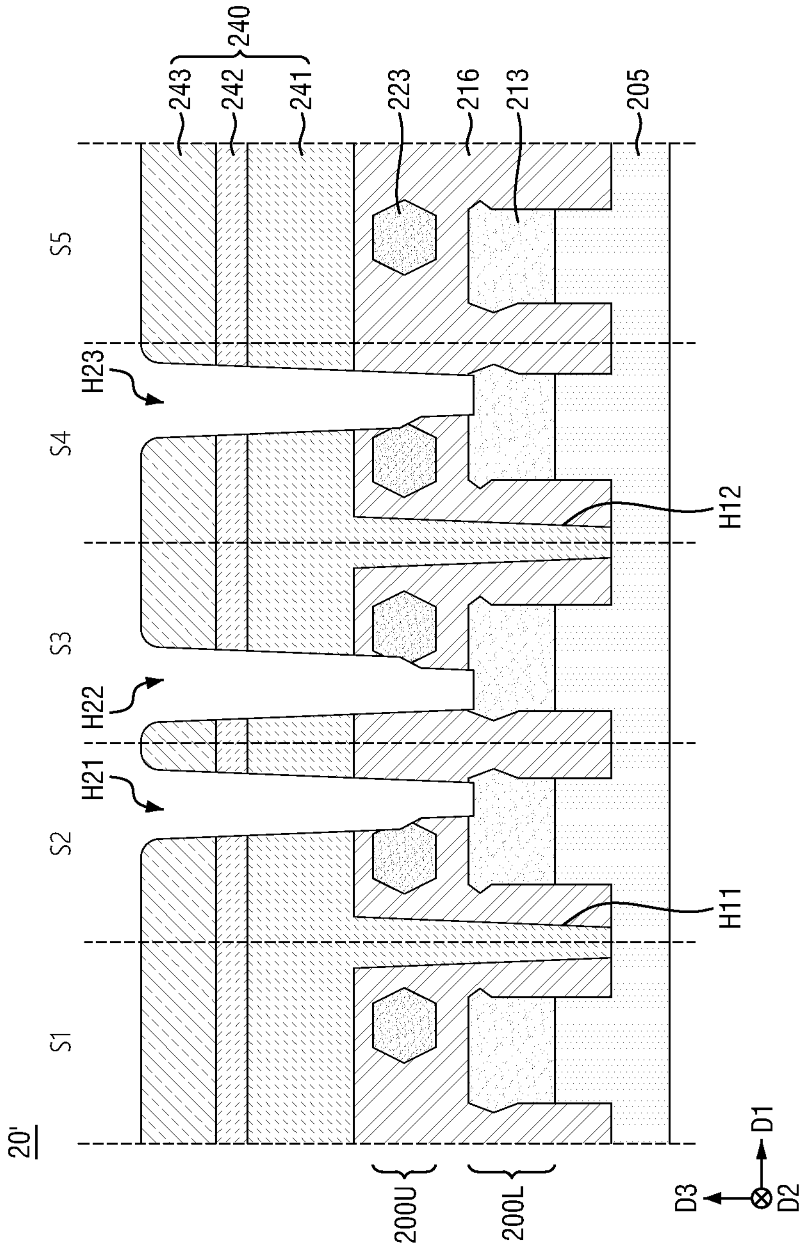

Referring to FIG. 4B, the $1^{st}$ masking structure 140 may be removed from the intermediate semiconductor device 20' obtained in the previous step through, for example, an ashing or stripping operation, not being limited thereto, followed by forming a $2^{nd}$ masking structure 240 on the intermediate semiconductor device 20'.

Like the $1^{st}$ masking structure 140, the $2^{nd}$ masking structure 240 may include an organic planarization layer 241, a silicon-containing anti-reflective coating layer 242 and a plurality of photoresist patterns 243. When the $2^{nd}$ masking structure 240 is formed on the intermediate semiconductor device 20', the organic planarization layer 241 may fill in the holes H11 and H12 in the intermediate semiconductor device 20' obtained in the previous step. Further, based on the $2^{nd}$ masking structure 240, the $1^{st}$ ILD structure 216 therebelow may be patterned to form holes H21, H22 and H23 in the $1^{st}$ ILD structure 216 through, for example, dry etching or wet etching, not being limited thereto.

The hole H21 may be formed at a non-overlapping region above a lower source/drain region 213 of the $2^{nd}$ 3DSFET S2 at a side of a upper source/drain region 223 of the $2^{nd}$ 3DSFET S2 in the $1^{st}$ ILD structure 216. The hole H21 may be formed to expose a side surface of the upper source/drain region 223 facing the non-overlapping region and a top surface of the lower source/drain region 213 at a bottom of the hole H21. In the hole H21, a common contact plug 237 connecting both the upper source/drain region 223 and the lower source/drain region 213 of the $2^{nd}$ 3DSFET S2 to a backside metal line 208 is to be formed in a later step.

The hole H22 may be formed at a non-overlapping region above a lower source/drain region 213 of the $3^{rd}$ 3DSFET S3 at a side of an upper source/drain region 223 of the $3^{rd}$ 3DSFET S3 in the $1^{st}$ ILD structure 216. The hole H22 may be formed to expose a side surface of the upper source/drain region 223 facing the non-overlapping region and a top surface of the lower source/drain region 213 at a bottom of the hole H22. The hole H22 may be provided to form therein a $2^{nd}$ target contact plug CM2 which will be etched to form an upper contact plug 227 and a lower contact plug 217 isolated by a metal-cut structure 250 for the $3^{rd}$ 3DSFET S3 in a later step. The hole H22 may correspond to the $2^{nd}$ hole referred to in operation S20 of FIG. 3.

The hole H23 may be formed at a non-overlapping region above a lower source/drain region 213 of the $4^{th}$ 3DSFET S4 at a side of an upper source/drain region 223 of the $4^{th}$ 3DSFET S4 in the $1^{st}$ ILD structure 216. The hole H23 may be formed to expose a side surface of the upper source/drain region 223 facing the non-overlapping region and a top surface of the lower source/drain region 213 at a bottom of the hole H23. The hole H23 may be combined with the hole H12 to form the $1^{st}$ target contact plug CM1 for the $4^{th}$ 3DSFET S4 in a later step. The hole H23 may correspond to the $3^{rd}$ hole referred to in operation S20 of FIG. 3.

In operation S30, the $2^{nd}$ masking structure may be removed, and a $3^{rd}$ etching operation using a $3^{rd}$ masking structure may be performed on the intermediate semiconductor device to widen the 2nd hole and the 3rd hole, reopen the 1st hole, and combine the widened 3rd hole with the reopened 1st hole.

Figure 4C:
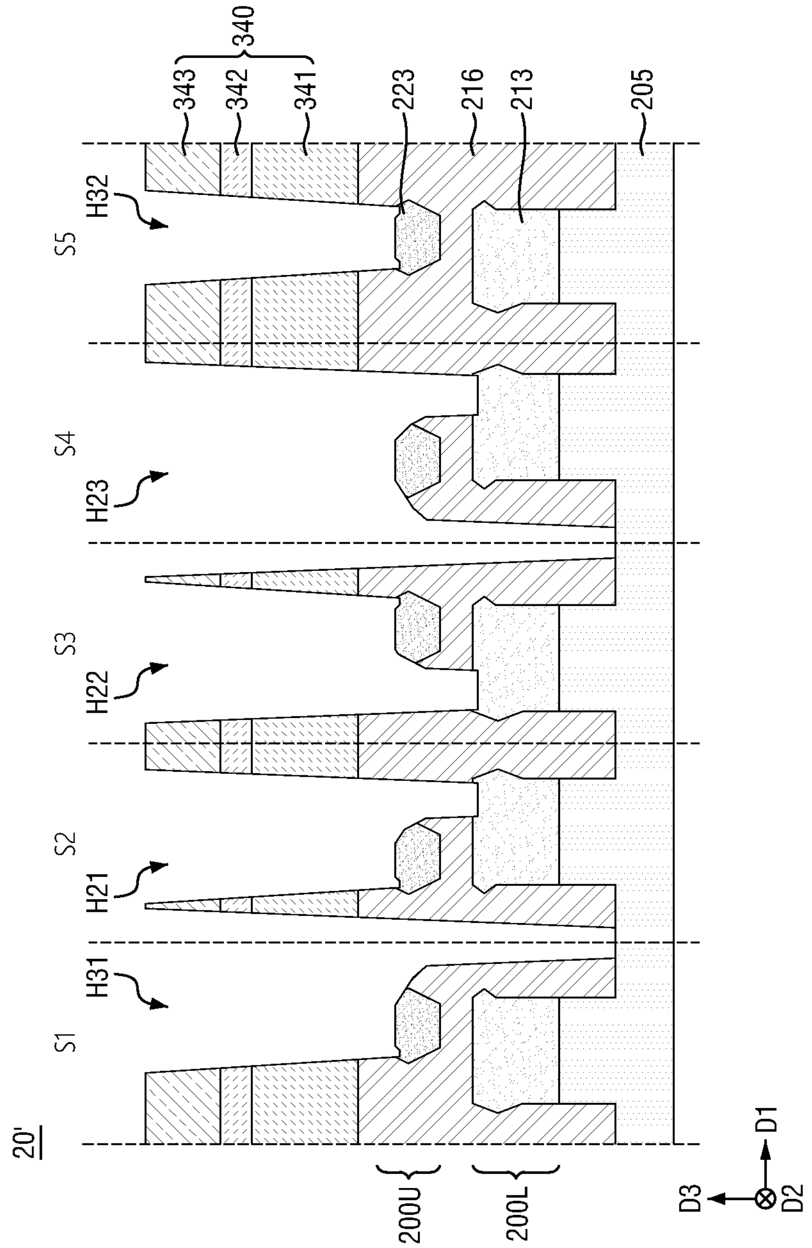

Referring to FIG. 4C, the 2nd masking structure 240 may be removed from the intermediate semiconductor device 20' obtained in the previous step through, for example, an ashing or stripping operation, not being limited thereto, followed by forming a 3rd masking structure 340 on the intermediate semiconductor device 20'.

Like the 2nd masking structure 240, the 3rd masking structure 340 may also include an organic planarization layer 341, a silicon-containing anti-reflective coating layer 342 and a plurality of photoresist patterns 343. Based on the 3rd masking structure 340, the intermediate semiconductor device 20' obtained in the previous step may be further patterned to widen the existing holes H21, H22 and H23 and newly form holes H31 and H32 in the 1st ILD structure 216 through, for example, dry etching or wet etching, not being limited thereto.

The hole H21 provided to form therein the common contact plug 237 may be widened to expose a top surface of the upper source/drain region 223 of the 2nd 3DSFET S2 in addition to the previously-exposed side surface of upper source/drain region 223 and top surface of the lower source/drain region 213 of the 2nd 3DSFET S2. By widening the hole H21, deposition of a metal or a metal compound therein to form the common contact plug 237 may be performed with a reduced risk of incomplete deposition such as formation of a void at a bottom surface of the hole H21.

The hole H22 provided to form therein the 2nd target contact plug CM2 may be widened to expose a top surface of the upper source/drain region 223 of the 3rd 3DSFET S3 in addition to the previously-exposed side surface of the upper source/drain region 223 and top surface of the lower source/drain region 213 of the 3rd 3DSFET S3. As the hole H22 is widened, deposition of a metal or a metal compound therein to form the 2nd target contact plug CM2 may be performed with a reduced risk of incomplete deposition such as formation of a void at a bottom surface of the hole H22.

The hole H23 provided to form therein the 1st target contact plug CM1 may be widened to expose a top surface of the upper source/drain region 223 of the 4th 3DSFET S4 in addition to the previously-exposed side surface of the upper source/drain region 223 and top surface of the lower source/drain region 213 of the 4th 3DSFET S4. Further, the hole H12 filled in with the organic planarization layer 241 in the previous step may be reopened to be combined with the widened hole H23 to expose the substrate 205 at the bottom of the reopened hole 12. As the hole H23 is widened and combined with the reopened hole H12, deposition of a metal or a metal compound therein to form the 1st target contact plug CM1 may be performed with a further reduced risk of incomplete deposition such as formation of a void at a bottom surface of the hole H23.

In this step, the hole H11 filed in with the organic planarization layer 241 in the previous step may also be reopened along with the hole H12.

The hole H31 may be formed to expose a top surface the upper source/drain region 223 of the 1st 3DSFET S1. Further, the hole H31 may be combined with the reopened hole H11 to expose the substrate at the bottom of the reopened hole 11. In the hole H31, an upper contact plug 227 connecting the top surface of the upper source/drain region 223 of the 1st 3DSFET S1 to a backside metal line 208 is to be formed in a later step.

The hole H32 may be formed to expose a top surface of the upper source/drain region 223 of the 5th 3DSFET S5. In the hole H32, an upper contact plug 227 connecting the top surface of the upper source/drain region 223 of the 5th 3DSFET S5 to a BEOL metal line 238 is to be formed in a later step.

In operation S40, the 3rd masking structure may be removed to expose the plurality of holes including the widened 2nd hole and 3rd hole.

Figure 4D:
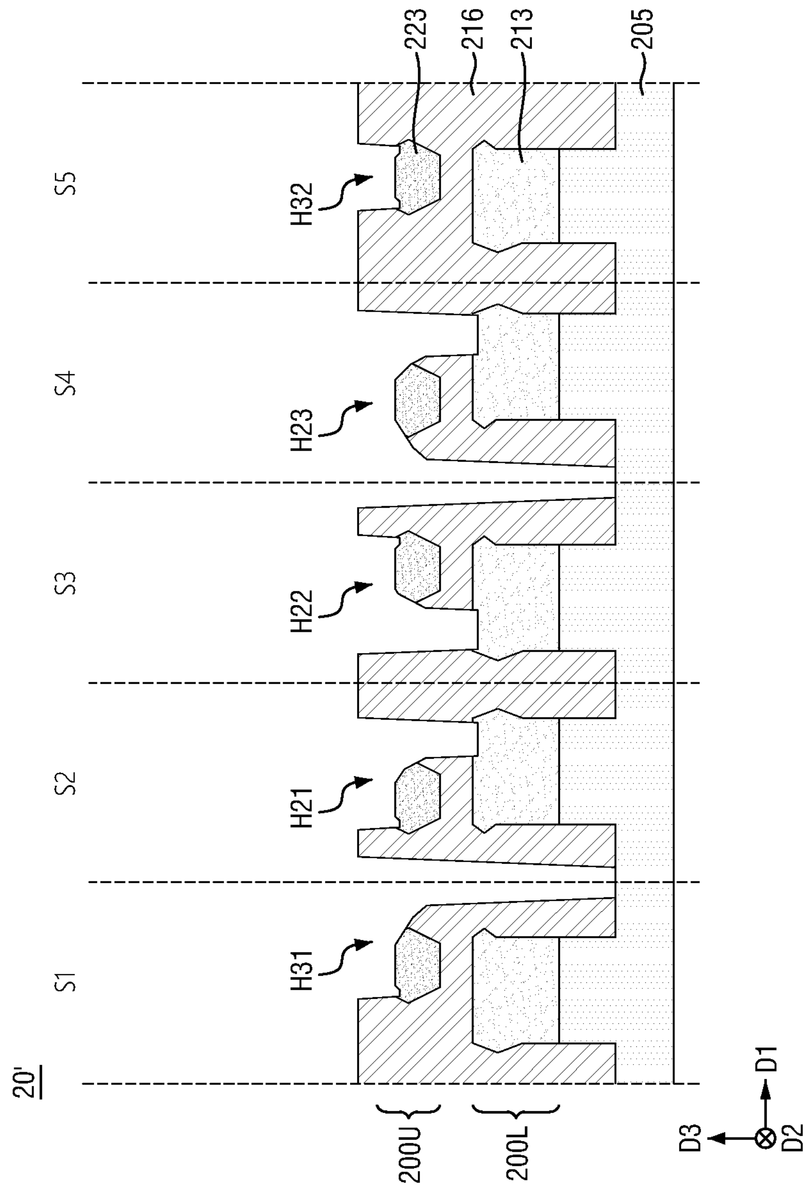

Referring to FIG. 4D, the 3rd masking structure 340 used to widen the holes H21, H22 and H23 and form the holes H31 and 32 are removed through, for example, an ashing or stripping operation, not being limited thereto, to leave these holes H21, H22, H23, H31 and H33 in the 1st ILD structure 216.

In operation S50, a barrier layer and/or metal or a metal compound is filled in the plurality of holes including the widened 2nd hole and 3rd hole to form a plurality of contact plugs including the 1st target contact plug and the 2nd target contact plug.

Figure 4E:
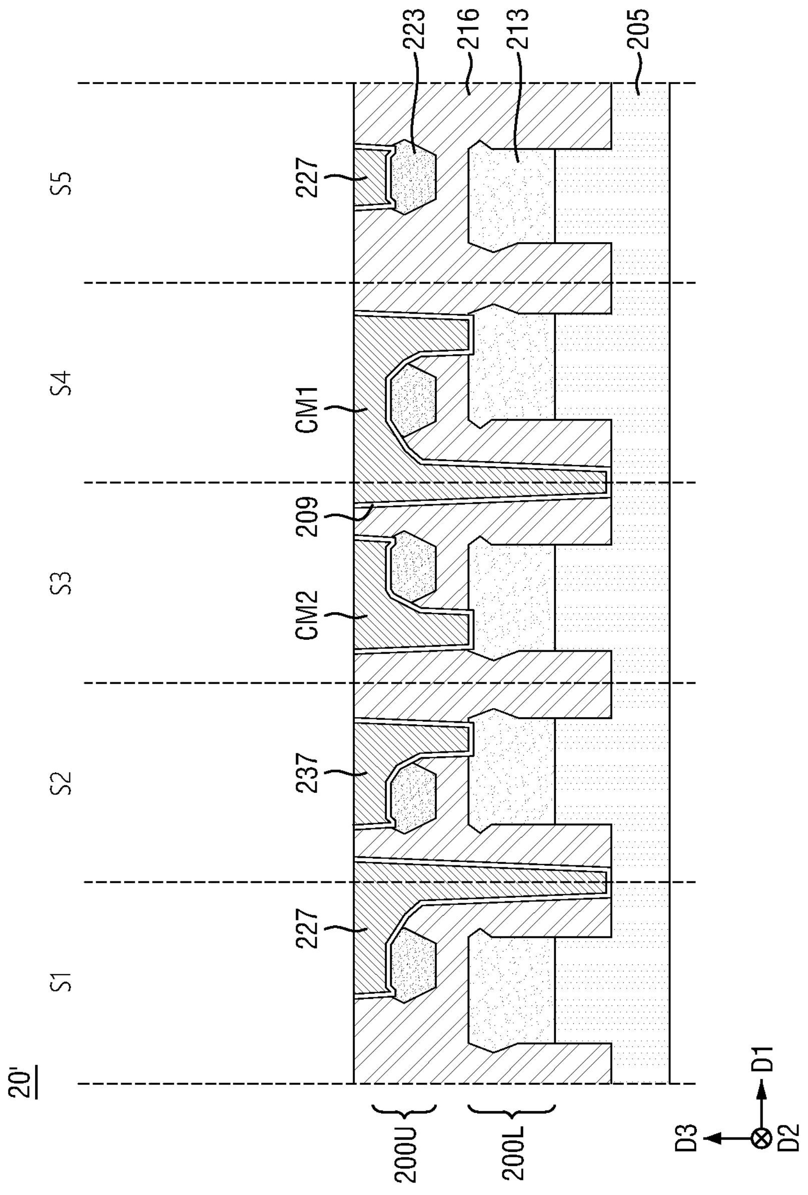

Referring to FIG. 4E, a metal or a metal compound may be filed in holes H21, H22, H23, H31 and H32 obtained in the previous step to form the upper contact plug 227 for the 1st 3DSFET S1, the common contact plug 237 for the 2nd 3DSFET S2, the 2nd target contact plug CM2 for the 3rd 3DSFET S3, the 1st target contact plug CM1 for the 4th 3DSFET S4, and the upper contact plug 227 for the 5th 3DSFET S5, respectively. The formation of these contact plugs may be performed through, for example, physical vapor deposition (PVD), chemical vapor deposition (CVD), plasma enhanced CVD (PECVD), radio-frequency CVD (RFCVD), atomic layer deposition (ALD), or the like, not being limited thereto.

As described above in reference to FIGS. 4C, the holes H21, H22, H23 and H31 may be each a widened hole, and thus, formation of the corresponding contact plugs including the target contact plugs CM1 and CM2 may be performed with a reduced risk of incomplete deposition such as formation of a void at a bottom surface of the hole.

Before the formation of the contact plugs, a barrier layer 209 may be formed in the holes H21, H22, H23, H31 and H32 through, for example, atomic layer deposition (ALD), not being limited thereto. As described earlier in reference to FIGS. 1A-1C, the barrier layer 209 may be formed to prevent or reduce diffusion of the metal or the metal compound forming the contact plugs into the 1st ILD structure 216. According to an embodiment, the barrier layer 209 may not be formed at an interface between each of the contact plugs and a corresponding source/drain region.

In operation S60, a 4th etching operation using a 4th masking structure may be performed on the intermediate semiconductor device, in which the plurality of contact plugs including the 1st target contact plug and the 2nd target contact plug are formed, to obtain a 1st target hole and a 2nd target hole in the 1st target contact plug and the 2nd target contact plug, thereby forming a lower contact plug and an upper contact plug for each of the 1st target 3DSFET and the 2nd target 3DSFET.

Figure 4F:
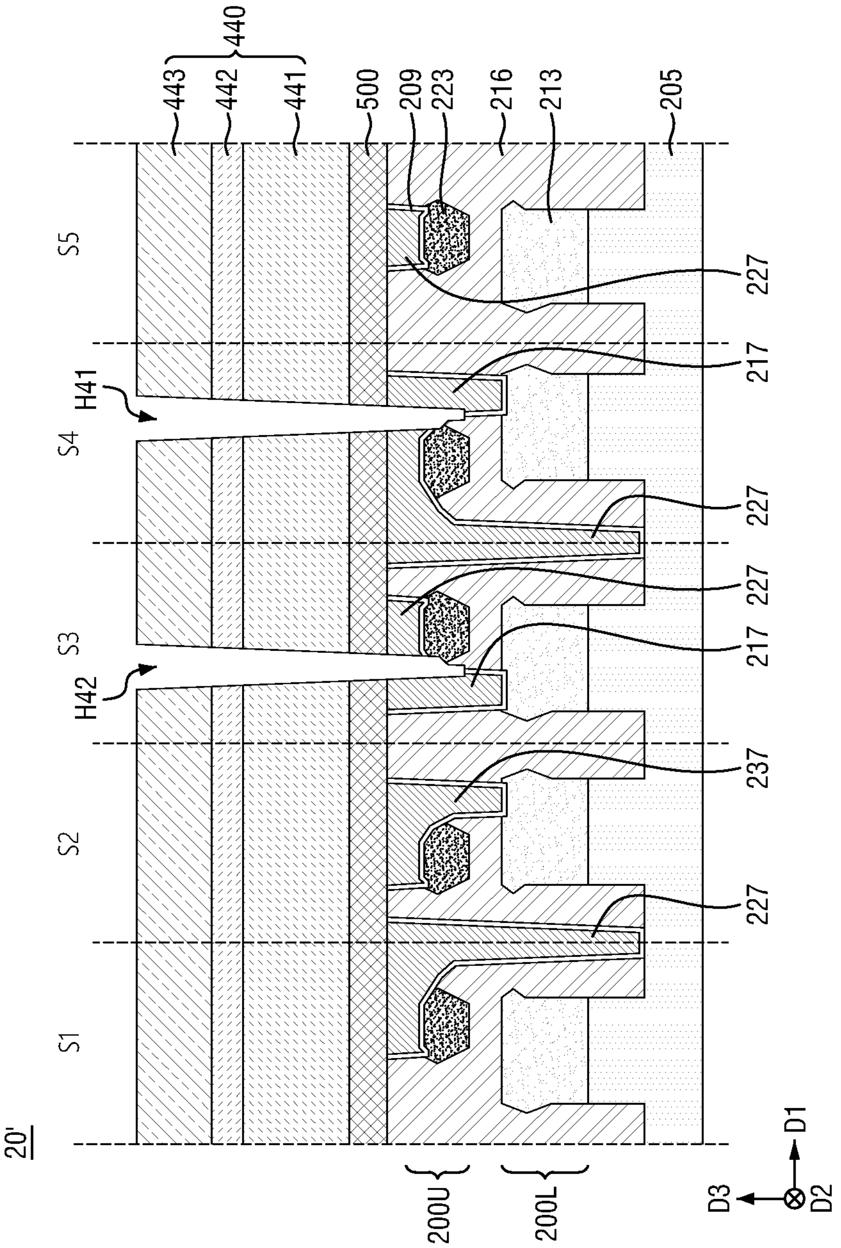

Referring to FIG. 4F, a 4th masking structure 440 may be formed on the intermediate semiconductor device 20' obtained in the previous step. The 4th masking structure 440 may also include an organic planarization layer 441, a silicon-containing anti-reflective coating layer 442 and a plurality of photoresist patterns 443. According to an embodiment, an additional mask layer 500 may be formed between the organic planarization layer 441 and a top surface of the intermediate semiconductor device 20'.

Based on the 4th masking structure 440, the additional mask layer 500 may be patterned at selected positions on the 1st target contact plug CM1 and the 2nd target contact plug CM2. Further, based on the patterned additional mask layer 500, the 1st target contact plug CM1 and the 2nd target contact plug CM2 may be etched from top to form a 1st target hole H41 and a 2nd target hole H42 in the 1st target contact plug CM1 and the 2nd target contact plug CM2, respectively. In the holes H41 and H42, the metal-cut structure 250 may be formed in a later step. The patterning and etching operations performed in this step may include dry etching and/or wet etching, for example, not being limited thereto. Further, the etching operation to form the target holes H41 and H42 may be anisotropic etching in a downward direction such that a width of the target holes H41 and H42 is tapered or decreased as described earlier in reference to FIGS. 2A and 2B.

The 1st target hole H41 may divide the 1st target contact plug CM1 to form a lower contact plug 217 and an upper contact plug 227 for the 4th 3DSFET S4 at a right side and a left side of the 1st target hole H41, respectively. Similarly, the 2nd target hole H42 may divide the 2nd target contact plug CM2 to form a lower contact plug 217 and an upper contact plug 227 for the 3rd 3DSFET S3 at a left side and a right side of the 2nd target hole H42. Each of the target holes H41 and H42 may expose, at its bottom portion, the 1st ILD structure 216 below the upper S/D regions.

In the meantime, the 1st target hole H41 may be formed by etching a portion of the target contact plug CM1 such that a distance between the lower contact plug 217 and the upper contact plug 227 and a distance between the lower contact plug and the upper source/drain region 223 are sufficient to isolate the lower contact plug 217 from each of the upper contact plug 227 and the upper source/drain region 223. These distances may correspond to the widths W4 and W3 described earlier in reference to FIG. 2B. Thus, during this etching operation to form the 1st target hole H41 through the 1st target contact plug CM1, at least a side portion of the upper source/drain region 223 facing the non-overlapping region of the 4th 3DSFET S4 may be dented by the etching operation performed on the target contact plug CM1. Similarly, at least a side portion of the upper source/drain region 223 of the 3rd 3DSFET S3 may also be dented by the etching operation performed on the target contact plug CM2.

The additional mask layer 500 may be formed of the same or similar material of the metal-cut structure 250 to facilitate formation of the metal-cut structure 250 in the target holes H41 and H42. For example, when the metal-cut structure 250 is formed of silicon nitride, the additional mask layer 500 may also be formed of the same or similar silicon nitride.

In operation S70, the 1st target hole and the 2nd target hole may be filled in with a metal-cut structure to isolate the lower contact plug from a upper source/drain region and the upper contact plug for each of the 1st 3DSFET and the 2nd 3DSFET, along with removing the 4th masking structure.

Figure 4G:
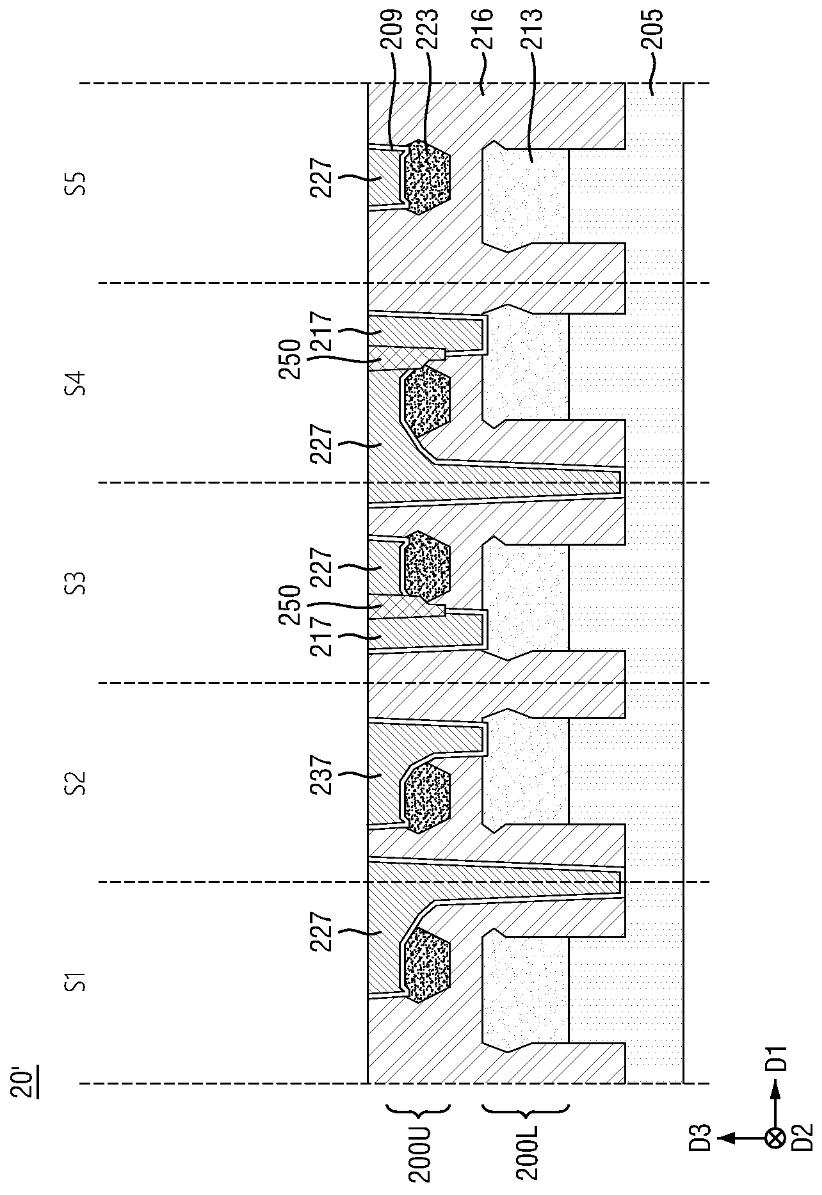

Referring to FIG. 4G, the metal-cut structure 250 may be filled in each of the 1st target hole H41 in the 1st target contact plug CM1 and the 2nd target hole H42 in the 2nd target contact plug CM2, and the 4th masking structure 440 may be removed with the additional mask layer 500. According to an embodiment, a material forming the metal-cut structure 250 may include silicon nitride (e.g., SiN, $Si_3N_4$, etc.). According to another embodiment, the material forming the metal-cut structure 250 may include silicon oxide (e.g., SiO, $SiO_2$, etc.).

According to an embodiment, the 4th masking structure 440 may be first removed by, for example, an ashing or stripping operation, not being limited thereto, and then, the metal-cut structure 250 may be filled in the target holes H41 and H42 with the additional mask layer 500 remaining on the 1st ILD structure 216 and the contact plugs including the target contact plug CM1 and CM2. Subsequently, the intermediate semiconductor device 20' with the additional mask layer 500 thereon may be planarized through, for example, a chemical-mechanical-planarization (CMP) operation to remove the additional mask layer 500 along with a residue of the material forming the metal-cut structure 250 remaining above a level of a top surface of the divided target contact plugs CM1 and CM2.

As the metal-cut structure 250 is filled in each of the 1st target hole H41 in the 1st target contact plug CM1 and the 2nd target hole H42 in the 2nd target contact plug CM2, the lower contact plug 217 and the upper contact plug 227 isolated from each other may be obtained for the 3rd 3DSFET S3 and the 4th 3DSFET S4.

As described above in reference to FIG. 4E, the target contact plugs CM1 and CM2 may be formed in the widened holes H23 and H22, respectively, without a reduced risk of incomplete deposition. Thus, the lower contact plug 217 and the upper contact plug 227 obtained by dividing the target contact plugs CM1 and CM2 may have an improved connection performance for the 3rd 3DSFET S3 and the 4th 3DSFET S4, respectively.

As described above in reference to FIG. 2B, the metal-cut structure 250 may have the smaller bottom width W3 than the top width W4 thereof, and thus, at least the lower contact plug 217 obtained by the metal-cut structure 250 and formed at a side of the metal-cut structure 250 may have the greater bottom width W5 than the top width W6 thereof. This bottom width W5 of the lower contact plug 217 may be greater than the bottom width W1 of the lower contact plug 117 shown in FIG. 1C. Thus, a reduced contact resistance may be achieved by the lower contact plug 217 formed based on the metal-cut structure 250, while a connection performance of the lower contact plug 217 may be improved.

As the metal-cut structure 250 is formed at this step, which is different from a step in which the 1st ILD structure 216 is formed to isolate the lower source/drain regions 213 and the upper source/drain regions 223 of the 3DSFETs S1-S5, there may be formed an interface between the 1st ILD structure 216 and the metal-cut structure 250 at least at the position P where the 1st ILD structure 216 contacts the metal-cut structure 250 in the semiconductor device 20, as shown in FIG. 2B.

Further, also as described above in reference to FIG. 2B, no barrier layer is formed at a side surface of each of the contact plugs 217 and 227 contacting the metal-cut structure 250, while other side surfaces thereof not contacting the metal-cut structure 250 may have the barrier layer 209 thereon.

In operation S80, a BEOL structure and a BSPDN structure may be added to the intermediate semiconductor device for connection to the plurality of contact plugs obtained in the previous step.

Figure 4H:
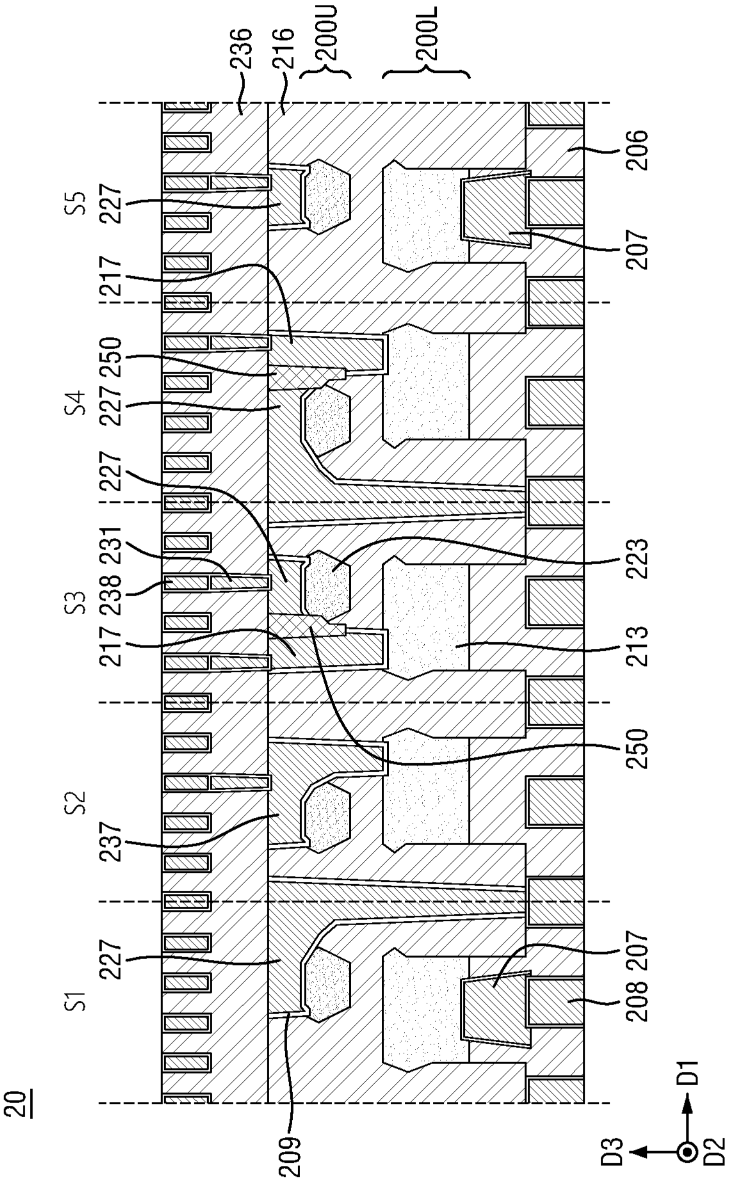

Referring to FIG. 4H, a BEOL structure and a BSPDN structure may be formed above and below the intermediate semiconductor device obtained in the previous step. The BEOL structure may include a plurality of BEOL metal lines 238 and via structures 231, and the BSPDN structure may include a plurality of backside metal lines 208 and backside contact plugs 207.

To form the BEOL structure, a 2nd ILD structure 236 may be formed and etched to form the BEOL metal lines 238 and the via structures 231 in the 2nd ILD structure 236. To form the BSPDN structure, the intermediate semiconductor device 20' with the BEOL structure thereon may be flipped upside down, and the substrate 205 may be replaced by a $3^{rd}$ ILD structure 206, in which the backside metal lines 208 and the backside contact plugs 207 may be formed.

Figure 5:
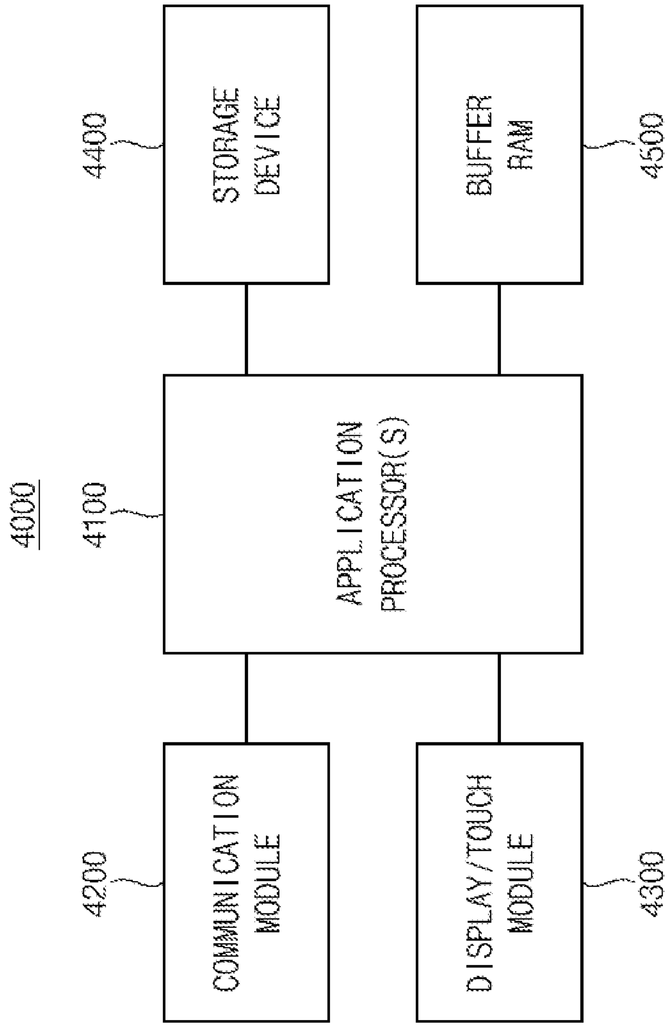
FIG. 5 is a schematic block diagram illustrating an electronic device including a semiconductor device including a plurality of 3DSFETs as shown in FIGS. 2A and 2B, according to an example embodiment.

FIG. 5 is a schematic block diagram illustrating an electronic device including a semiconductor device including a plurality of 3DSFETs as shown in FIGS. 2A and 2B, according to an example embodiment.

Referring to FIG. 5, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 5, the electronic device 4000 may further include at least one sensor such as an image sensor.

At least one component in the electronic device 4000 may include at least one of the $1^{st}$ to $5^{th}$ 3DSFETs S1-S5 or the semiconductor device 20 shown in FIGS. 2A and 2B.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A three-dimensionally-stacked field-effect transistor (3DSFET) device comprising:

a $1^{st}$ source/drain region;

a $2^{nd}$ source/drain region, above the $1^{st}$ source/drain region, having a smaller width than the $1^{st}$ source/drain region, the $2^{nd}$ source/drain region being isolated from the $1^{st}$ source/drain region by a $1^{st}$ isolation structure;

a $1^{st}$ contact plug on the $1^{st}$ source/drain region;

a $2^{nd}$ contact plug on the $2^{nd}$ source/drain region; and a $2^{nd}$ isolation structure, between the $1^{st}$ contact plug and the $2^{nd}$ contact plug, isolating the $2^{nd}$ contact plug from the $1^{st}$ contact plug, wherein the $2^{nd}$ isolation structure is different and separate from the $1^{st}$ isolation structure, wherein a top surface of the $1^{st}$ isolation structure extends in a $1^{st}$ direction and a $2^{nd}$ direction that intersects the $1^{st}$ direction, wherein the $1^{st}$ isolation structure overlaps at least one of the $1^{st}$ source/drain region and the $2^{nd}$ source/drain region in at least one of the $1^{st}$ direction and the $2^{nd}$ direction, and wherein a top surface of the $2^{nd}$ isolation structure is farther than a bottom surface of the $2^{nd}$ source/drain region from a top surface of the $1^{st}$ source/drain region in a $3^{rd}$ direction that is perpendicular to the $1^{st}$ direction and the $2^{nd}$ direction.

2. The 3DSFET device of claim 1, wherein the $2^{nd}$ isolation structure is extended to a space between the $1^{st}$ contact plug and the $2^{nd}$ source/drain region, and isolates the $1^{st}$ contact plug from the $2^{nd}$ source/drain region.

3. The 3DSFET device of claim 1, wherein no barrier layer is formed on a portion of a side surface of at least one of the $1^{st}$ contact plug and the $2^{nd}$ contact plug contacting the $1^{st}$ isolation structure, and wherein a barrier layer is formed on another portion of the side surface of the at least one of the $1^{st}$ contact plug and the $2^{nd}$ contact plug that does not contact the $2^{nd}$ isolation structure.

4. The 3DSFET device of claim 1, wherein the $2^{nd}$ isolation structure comprises a material different from a material forming the $1^{st}$ isolation structure.

5. The 3DSFET device of claim 4, wherein the $2^{nd}$ isolation structure comprises silicon nitride.

6. The 3DSFET device of claim 1, wherein a bottom width of the $1^{st}$ contact plug is greater than a top width of the $1^{st}$ contact plug.

7. The 3DSFET device of claim 1, wherein a shape of a portion of the $2^{nd}$ source/drain region contacting the $2^{nd}$ isolation structure is different from a shape of an opposite portion of the $2^{nd}$ source/drain region that does not contact the $2^{nd}$ isolation structure.

8. The 3DSFET device of claim 7, wherein at least a side surface of the $2^{nd}$ source/drain region contacting the $2^{nd}$ isolation structure is dented.

9. The 3DSFET device of claim 8, wherein a top edge portion of the $2^{nd}$ source/drain region comprising a portion of a top surface thereof contacting the $2^{nd}$ isolation structure is dented.

10. The 3DSFET device of claim 1, wherein the $1^{st}$ isolation structure comprises silicon nitride, and the $2^{nd}$ isolation structure comprises silicon oxide.

11. The 3DSFET device of claim 1, wherein the $1^{st}$ isolation structure contacts the $2^{nd}$ isolation structure, and wherein a top surface of the $1^{st}$ isolation structure is farther than the bottom surface of the $2^{nd}$ source/drain region from the top surface of the $1^{st}$ source/drain region in the $3^{rd}$ direction.

12. The 3DSFET device of claim 1, wherein the $1^{st}$ isolation structure comprises silicon oxide, and wherein an interface is formed between the $1^{st}$ isolation structure and the $2^{nd}$ isolation structure.

13. The 3DSFET device of claim 1, further comprising:

at least one $1^{st}$ metal line below the $1^{st}$ source/drain region; and at least one $2^{nd}$ metal line above the $2^{nd}$ source/drain region, wherein the $1^{st}$ contact plug is connected to the $1^{st}$ metal line, and wherein the $2^{nd}$ contact plug is connected to the $2^{nd}$ metal line.

14. The 3DSFET device of claim 1, further comprising:

a plurality of metal lines above the $2^{nd}$ source/drain region, wherein the $1^{st}$ contact plug and the $2^{nd}$ contact plug are connected to the metal lines, respectively.

15. A semiconductor device comprising:

the 3DSFET device of claim 1; and another 3DSFET device comprising:

a $3^{rd}$ source/drain region, a 4th source/drain region, above the $3^{rd}$ source/drain region, having a smaller width than the $3^{rd}$ source/drain region, a $3^{rd}$ contact plug on the $3^{rd}$ source/drain region, a 4th contact plug on the 4th source/drain region, and another $2^{nd}$ isolation structure, between the $3^{rd}$ contact plug and the 4th contact plug, isolating the 4th contact plug from the $3^{rd}$ contact plug, wherein the another $2^{nd}$ isolation structure is different and separate from the $1^{st}$ isolation structure isolating the 4th source/drain region from the $3^{rd}$ source/drain region;

a plurality of $1^{st}$ metal lines below at least one of the $1^{st}$ source/drain region and the $3^{rd}$ source/drain region; and a plurality of $2^{nd}$ metal lines above at least one of the $2^{nd}$ source/drain region and the 4th source/drain region, wherein at least one of the $1^{st}$ to $4^{th}$ contact plugs is connected to at least one of the $1^{st}$ metal lines, and wherein another at least one of the $1^{st}$ to $4^{th}$ contact plugs is connected to at least one of the $2^{nd}$ metal lines.

16. A semiconductor device comprising:

the 3DSFET device of claim 1; and another 3DSFET device comprising:

a $3^{rd}$ source/drain region, a $4^{th}$ source/drain region, above the $3^{rd}$ source/drain region, having a smaller width than the $3^{rd}$ source/drain region, and a common contact plug connected to both the $3^{rd}$ source/drain region and the $4^{th}$ source/drain region;

a plurality of $1^{st}$ metal lines below at least one of the $1^{st}$ source/drain region and the $3^{rd}$ source/drain region; and a plurality of $2^{nd}$ metal lines above at least one of the $2^{nd}$ source/drain region and the $4^{th}$ source/drain region, wherein at least one of the $1^{st}$ contact plug, the $2^{nd}$ contact plug and the common contact plug is connected to at least one of the $1^{st}$ metal lines, and wherein another at least one of the $1^{st}$ contact plug, the $2^{nd}$ contact plug and the common contact plug is connected to at least one of the $2^{nd}$ metal lines.

17. A method of manufacturing a semiconductor device, the method comprising:

providing at least one three-dimensionally-stacked field-effect transistor (3DSFET) comprising a $1^{st}$ source/drain region and a $2^{nd}$ source/drain region, above the $1^{st}$ source/drain region, having a smaller width than the $1^{st}$ source/drain region and isolated from the $1^{st}$ source/drain region by a $1^{st}$ isolation structure;

forming a $1^{st}$ hole exposing both the $1^{st}$ source/drain region and the $2^{nd}$ source/drain region;

forming, in the $1^{st}$ hole, a contact plug contacting both the $1^{st}$ source/drain region and the $2^{nd}$ source/drain region;

forming a $2^{nd}$ hole dividing the contact plug into a $1^{st}$ contact plug on the $1^{st}$ source/drain region and a $2^{nd}$ contact plug on the $2^{nd}$ source/drain region; and forming, in the $2^{nd}$ hole, a $2^{nd}$ isolation structure different and separate from the $1^{st}$ isolation structure, wherein a top surface of the $1^{st}$ isolation structure extends in a $1^{st}$ direction and a $2^{nd}$ direction that intersects the $1^{st}$ direction, wherein the $1^{st}$ isolation structure overlaps at least one of the $1^{st}$ source/drain region and the $2^{nd}$ source/drain region in at least one of the $1^{st}$ direction and the $2^{nd}$ direction, and wherein a top surface of the $2^{nd}$ isolation structure is farther than a bottom surface of the $2^{nd}$ source/drain region from a top surface of the $1^{st}$ source/drain region in a $3^{rd}$ direction that is perpendicular to the $1^{st}$ direction and the $2^{nd}$ direction.

18. The method of claim 17, wherein the $2^{nd}$ isolation structure comprises a material different from a material forming the $1^{st}$ isolation structure.

19. The method of claim 18, wherein the $2^{nd}$ isolation structure comprises silicon nitride, and the $1^{st}$ isolation structure comprises silicon oxide.

20. The method of claim 17, wherein the forming the $1^{st}$ hole comprises:

forming an initial hole exposing one of the $1^{st}$ source/drain region and the $2^{nd}$ source/drain region; and widening the initial hole to obtain the $1^{st}$ hole.

* * * * *